(12) United States Patent
Kawasaki

(10) Patent No.: US 11,231,648 B2
(45) Date of Patent: Jan. 25, 2022

(54) IMPRINT DEVICE, IMPRINT METHOD, AND METHOD FOR MANUFACTURING ARTICLE

(71) Applicant: CANON KABUSHIKI KAISHA, Tokyo (JP)

(72) Inventor: Youji Kawasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 168 days.

(21) Appl. No.: 16/374,056

(22) Filed: Apr. 3, 2019

(65) Prior Publication Data

US 2019/0317396 A1    Oct. 17, 2019

(30) Foreign Application Priority Data

Apr. 13, 2018 (JP) .............................. JP2018-077549

(51) Int. Cl.
*G03F 7/00* (2006.01)
(52) U.S. Cl.
CPC .................................. *G03F 7/0002* (2013.01)
(58) Field of Classification Search
CPC ............... G03F 7/0002; G03F 7/70716; G03F 7/70775; G03F 7/70825
See application file for complete search history.

(56) References Cited

U.S. PATENT DOCUMENTS

2019/0291309 A1*  9/2019  Kondo .................... B29C 59/02

FOREIGN PATENT DOCUMENTS

JP       2017147277 A    8/2017

OTHER PUBLICATIONS

Machine translation of Specification of Application JP2016026155.A (Year: 2017).*

* cited by examiner

*Primary Examiner* — Robert J Grun
(74) *Attorney, Agent, or Firm* — Rossi, Kimms & McDowell LLP

(57) ABSTRACT

An imprint device which minimizes the occurrence of pattern defects. The imprint device for forming a pattern made of an imprint material on a shot region formed on a substrate using a mold includes: a supply unit configured to discharge the imprint material through a discharge port and supply the imprint material onto the substrate, a substrate stage configured to hold and move the substrate, and a control unit configured to control the substrate stage. The control unit moves the substrate stage so that a shot region having the pattern formed thereon avoids a portion immediately below the discharge port.

8 Claims, 5 Drawing Sheets

IMPRINT DEVICE, IMPRINT METHOD, AND METHOD FOR MANUFACTURING ARTICLE

BACKGROUND OF THE INVENTION

Field of the Invention

The present invention relates to an imprint device, an imprint method, and a method for manufacturing an article.

Description of the Related Art

There are micro-processing technologies in which a pattern is formed by bringing a mold into contact with an imprint material on a substrate. Examples of a method for supplying an imprint material onto a substrate include an inkjet type. In this method, droplets of an imprint material are dropped onto a substrate through a nozzle through which an imprint material is discharged. At the time of dropping, droplets are divided into main droplets and sub droplets (satellite droplets) and the satellite droplets adhere to a region other than a desired dropping position in some cases. When the satellite droplets adhere to the patterned region, pattern defects can occur, for example, by forming a bridge between patterns.

Japanese Patent Laid-Open No. 2017-147277 discloses technology of minimizing the occurrence of pattern defects by forming an air flow in a direction orthogonal to a supply path of an imprint material and blowing the mist of satellite droplets or the like generated at the time of supplying an imprint material to a region before imprint processing (a region not to be processed).

However, in the technology in Japanese Patent Laid-Open No. 2017-147277, when satellite droplets with sizes that are not blown by to an air flow are generated, the satellite droplets can adhere to the patterned region.

SUMMARY OF THE INVENTION

An purpose of the present invention is to provide, for example, an imprint device that is advantageous in minimizing the occurrence of pattern defects.

In order to accomplish the above-described objective, the present invention provides an imprint device for forming a pattern made of an imprint material on a shot region formed on a substrate using a mold, comprising: a supply unit configured to discharge the imprint material through a discharge port and supply the imprint material onto the substrate; a substrate stage configured to hold and move the substrate; and a control unit configured to control the substrate stage, wherein the control unit moves the substrate stage so that a shot region having the pattern formed thereon avoids a portion immediately below the discharge port.

Further features of the present invention will become apparent from the following description of exemplary embodiments with reference to the attached drawings.

According to the present invention, for example, it is possible to provide an imprint device that is advantageous in minimizing the occurrence of pattern defects.

DESCRIPTION OF THE EMBODIMENTS

An embodiment for carrying out the present invention will be described below with reference to the drawings.

Figure 1:
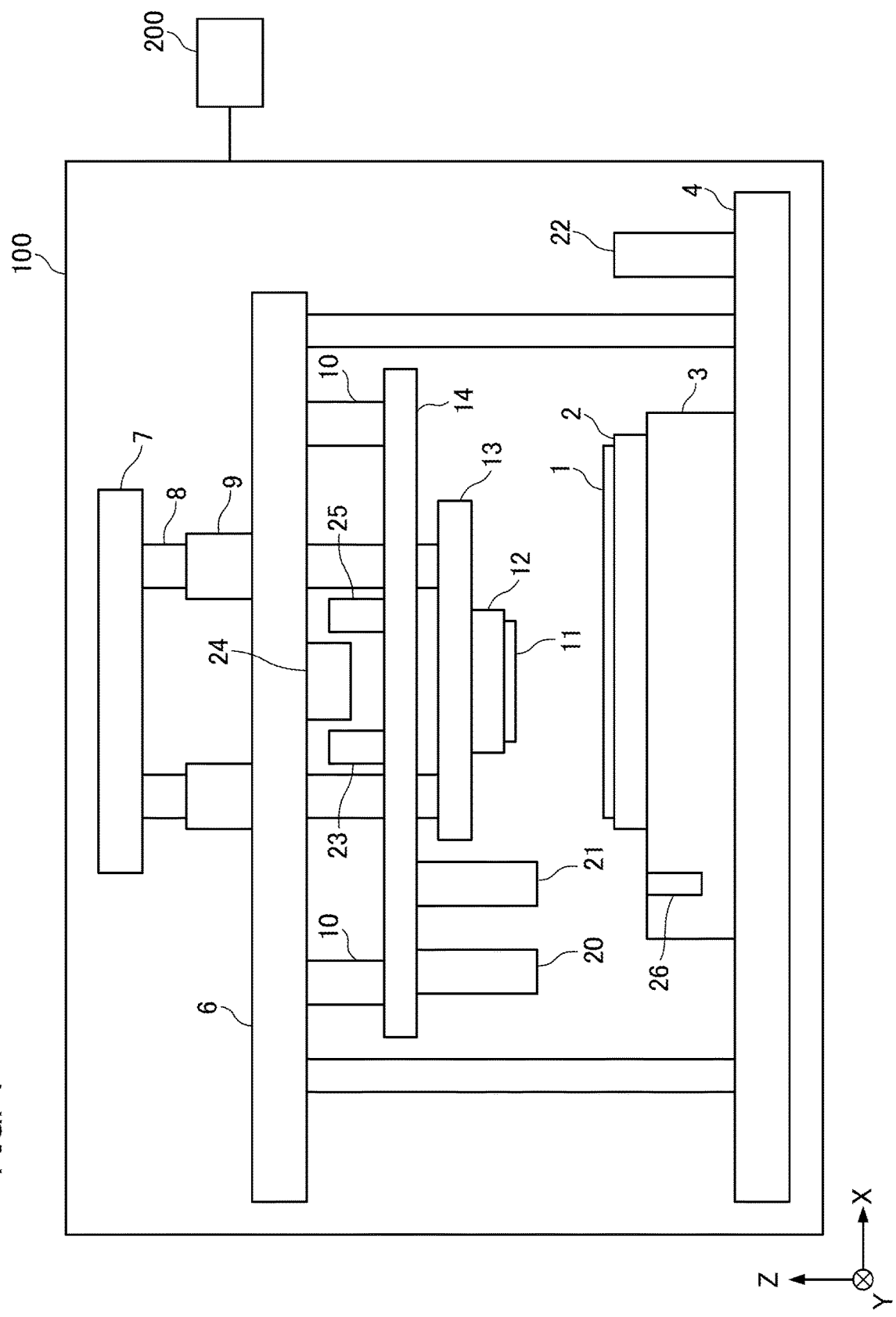
FIG. 1 is a schematic diagram illustrating a configuration of an imprint device.

FIG. 1 is a schematic diagram illustrating a configuration of an imprint device 100. The imprint device 100 performs an imprint process for patterning an imprint material on a substrate 1 using a mold 11. The imprint process is a process of bringing an imprint material on a substrate into contact with (imprinting it on) a mold, curing the imprint material in a contact state, and releasing the mold from the cured imprint material to form a pattern made of the imprint material on the substrate. Furthermore, the imprint process may include a step of supplying the uncured imprint material onto the substrate 1. Examples of a method of curing the imprint material include a method using light irradiation and methods using other types of energy (for example, heat). That is to say, examples of energy for curing include electromagnetic waves, heat, and the like. As electromagnetic waves, for example, electromagnetic waves with a wavelength of 10 nanometer or more and 1 millimeter or less are selected and any light of infrared rays, visible rays, and ultraviolet rays may be used.

In the embodiment, a photo-curing method using a photo-curable resin capable of curing by ultraviolet rays as the imprint material is adopted. In FIG. 1, a Z axis is defined as being parallel to an optical axis of ultraviolet rays radiated to the imprint material on the substrate 1 and an X axis and a Y axis orthogonal to each other are defined in a plane perpendicular to the Z axis.

A curable composition cured by curing energy to be applied is used as the imprint material. The curable composition is a composition cured through light irradiation or heating. A photo-curable composition cured through light irradiation includes at least a polymerizable compound and a photopolymerization initiator and may include a non-polymerizable compound or a solvent if necessary. The non-polymerizable compound is at least one selected from the group of a sensitizer, a hydrogen donor, an internal additive type releasing agent, a surfactant, an antioxidant, a polymer component, and the like.

The imprint material can be supplied onto the substrate 1 in the form of droplets or in the form of islands or films obtained by connecting a plurality of droplets through a liquid discharging head. The viscosity (viscosity at 25° C.) of the imprint material can be, for example, 1 mPa·s or more and 100 mPa·s or less.

The substrate 1 can be a member made of glass, a ceramic, a metal, a semiconductor, a resin, or the like. A layer made of a material different from the member may be formed on a surface of the member if necessary. The substrate 1 is, for example, a silicon wafer, a compound semiconductor wafer, a quartz glass plate, or the like. A plurality of shot regions are formed on the substrate 1 and a pattern can be formed on each of the shot regions of the substrate 1 by repeating the imprint process for each of the shot regions.

The substrate 1 is loaded from the outside of the imprint device 100 by a conveying unit 22 including a conveying hand, a loading/unloading port, and the like and held by a chuck 2. A substrate stage 3 is placed on a base surface plate 4 and moves while holding the substrate 1. The substrate stage 3 positions the substrate 1 at a predetermined position in an X-axis direction and a Y-axis direction.

The mold 11 has a pattern portion in which an outer circumferential portion is rectangular and a predetermined concave-convex pattern is formed three-dimensionally on a surface facing the substrate 1. The concave-convex pattern formed on the pattern portion of the mold 11 is transferred to the imprint material applied on the substrate 1. For example, a material through which ultraviolet rays are transmitted, such as quartz, is used as a material of the mold 11. The mold 11 is fixed to a mold chuck 12. The mold chuck 12 is placed on a mold stage 13. The mold stage 13 has a function of correcting an inclination of the mold 11 in a rotational direction of the Z axis. The mold chuck 12 and the mold stage 13 respectively have openings (not shown) through which light radiated from a light source 24 via a collimator lens is transmitted. Furthermore, a load cell for detecting a pressing force of the mold 11 is disposed on the mold chuck 12 (or the mold stage 13).

A guide bar plate 7 fixes one end of a guide bar 8. The guide bar 8 penetrates a top plate 6 and the other end is fixed to the mold stage 13. A mold elevating unit 9 drives the guide bar 8 in the Z-axis direction to bring (press) the mold 11 held by the mold chuck 12 into contact with (against) the imprint material on the substrate 1 or separates the mold 11 from the imprint material on the substrate 1.

An alignment shelf 14 is suspended on the top plate 6 via support columns 10. The guide bars 8 penetrates the alignment shelf 14. Furthermore, on the alignment shelf 14, a height measuring system (not shown) for measuring a height (flatness) of the substrate 1 held by the chuck 2 is disposed using, for example, an oblique incident image deviation method.

A through-the-mold (TTM) alignment scope 23 used for alignment of the mold 11 has an optical system and an imaging system for observing a reference mark on the substrate stage 3 and an alignment mark provided on the mold 11. The TTM alignment scope 23 is used for so-called die-by-die type alignment in which a relative position between a mark on the substrate 1 and the alignment mark provided on the mold 11 is measured for each of the shot regions and this positional deviation is corrected.

An off-axis alignment (OA) scope 21 is placed on the alignment shelf 14. The OA scope 21 is used for a global alignment process of measuring alignment marks provided on the plurality of shot regions on the substrate 1 and determining positions of the plurality of shot regions. It is possible to perform relative alignment between the mold 11 and the substrate 1 by acquiring a positional relationship between the mold 11 and the substrate stage 3 through the TTM alignment scope 23 and acquiring a positional relationship between the substrate stage 3 and the substrate 1 through the OA scope 21.

A spread camera 25 is disposed at a position at which the spread camera 25 overlooks the mold 11 and observes the mold 11 and the substrate 1 in contact with the imprint material on the substrate 1 by superimposing the mold 11 and the substrate 1 at the same field angle. The spread camera 25 is used for observing a state in which the mold 11 is filled with the imprint material by imaging a state in which the imprint material supplied onto the substrate 1 is filled up to the mold 11.

A measuring unit 26 is disposed on the substrate stage 3. In a state in which the substrate stage 3 and the mold 11 are moved relative to each other, the measuring unit 26 measures a distance between the mold 11 held by the mold chuck 12 and the substrate stage 3 a plurality of times. It is possible to determine whether the mold 11 is held normally by the mold chuck 12 on the basis of the distance between the mold 11 and the substrate stage 3 measured through the measuring unit 26. When the mold 11 is not held normally by the mold chuck 12, the mold 11 is unintentionally dropped and breaks or the mold 11 comes into contact with the imprint material on the substrate 1 at an unintended angle and the accuracy of the pattern formed on the substrate 1 decreases. In such a case, the imprint process may stop and a restoration process for making the mold 11 to be normally held by the mold chuck 12 may be performed.

A supply unit 20 includes a discharge port (nozzle) configured to discharge droplets of the imprint material toward the substrate 1 and supplies (applies) the imprint material to each of the plurality of shot regions on the substrate 1. The supply unit 20 adopts, for example, a piezo jet system, a micro solenoid system, or the like and can supply the imprint material having a minute volume of about 1 pL (picoliter) onto the substrate 1. The number of discharge ports in the supply unit 20 is not limited and may be one (a single nozzle) or more than 100 (that is, a linear nozzle array may be used or a plurality of linear nozzle arrays may be combined).

A control unit 200 includes a CPU, a memory, and the like and controls the entire imprint device 100. The control unit 200 controls each unit in the imprint device 100 to perform an imprint process. In the embodiment, the control unit 200 controls the movement of the substrate stage 3 and determines a movement path of the substrate stage 3 from when the substrate 1 is held by the substrate stage 3 to when the substrate 1 is unloaded from the imprint device 100.

When the inkjet type supply unit 20 supplies the imprint material to the shot regions on the substrate 1 or before or after the inkjet type supply unit 20 supplies the imprint material to the shot regions on the substrate 1, some of the imprint material forms misty micro-droplets (mist) and scatters to neighboring shot regions in some cases. When a shot region having a pattern already formed thereon through a portion immediately below the discharge port in the supply unit 20, the pattern can be affected by the mist and pattern defects can occur. The control unit 200 moves the substrate stage 3 so that the shot region having the pattern formed thereon passes through while avoiding a portion immediately below the discharge port.

Figure 2A:
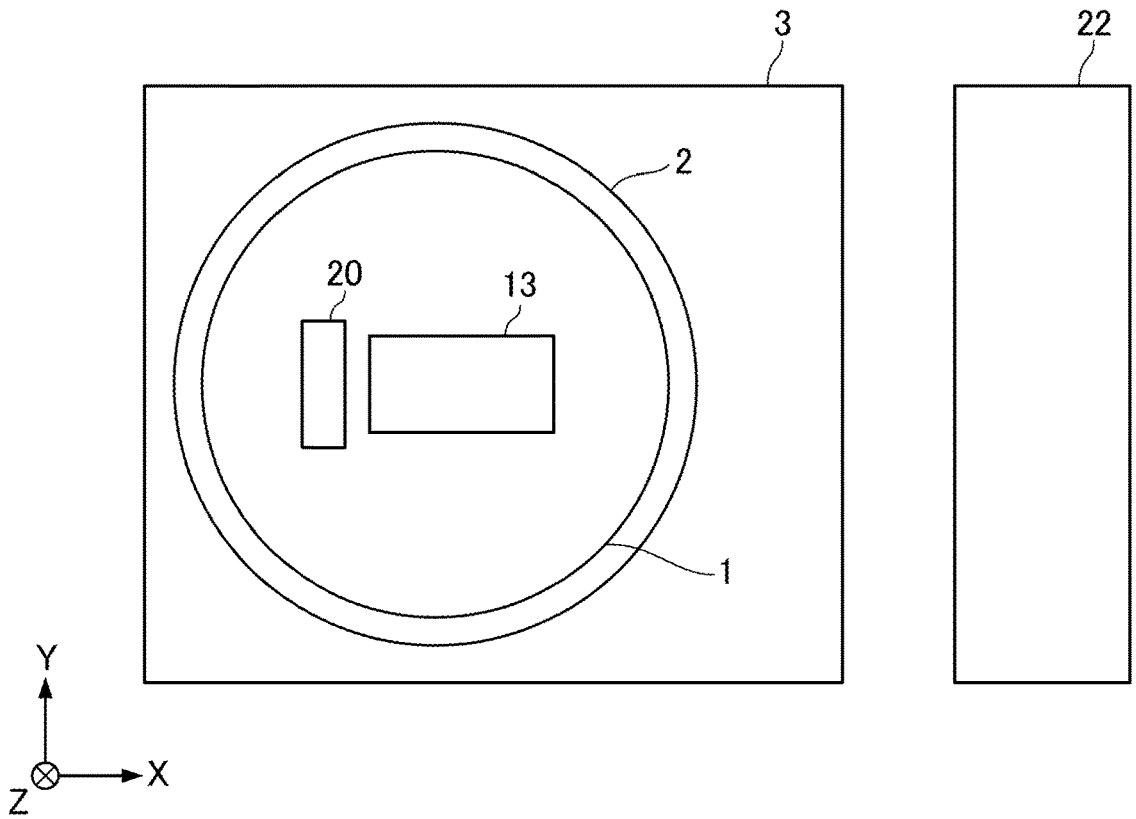
FIG. 2A is a diagram illustrating a positional relationship between a mold stage, a supply unit, and a conveying unit.
Figure 2B:
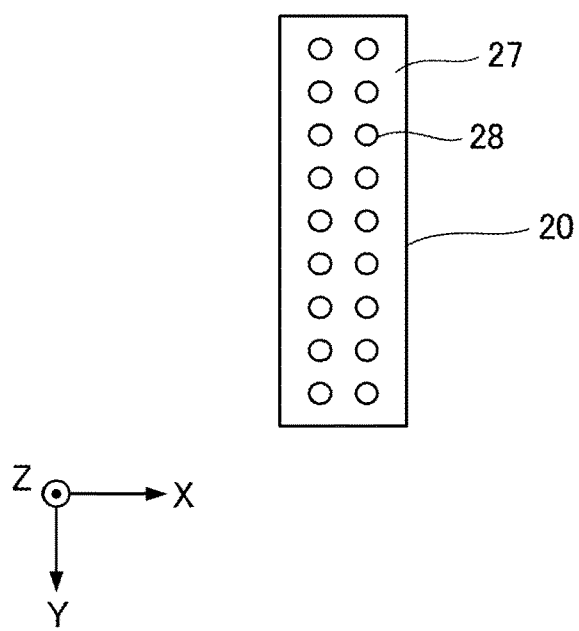
FIG. 2B is a diagram illustrating a discharge port.

FIGS. 2A and 2B are diagrams illustrating a positional relationship between the mold stage 13, the supply unit 20, and the conveying unit 22. FIG. 2A is a diagram of the mold stage 13, the supply unit 20, and the conveying unit 22 viewed in a +Z direction. In the imprint device 100 according to the embodiment, the mold stage 13 is disposed between the supply unit 20 and the conveying unit 22. When loaded from the conveying unit 22, the substrate 1 is held by the chuck 2 in the substrate stage 3 and moved to a portion immediately below the supply unit 20. FIG. 2B is a diagram illustrating a discharge port 28 and is a diagram of the supply unit 20 viewed in a −Z direction which is the substrate 1 side. The supply unit 20 has a plurality of discharge ports 28 in a discharge surface 27 facing the substrate 1. The supply unit 20 discharges the imprint material through the discharge port 28 and supplies the imprint material to a shot region to be subjected to the imprint process.

The substrate 1 having the imprint material supplied thereto is moved to a portion immediately below the mold 11 using the substrate stage 3. When the substrate 1 is moved to the portion immediately below the mold 11, alignment is performed and the imprint process is performed on a target shot region. When this process is repeated and the imprint process has been performed on all of the shot regions, the substrate 1 is unloaded from the device using the conveying unit 22.

Figure 3:
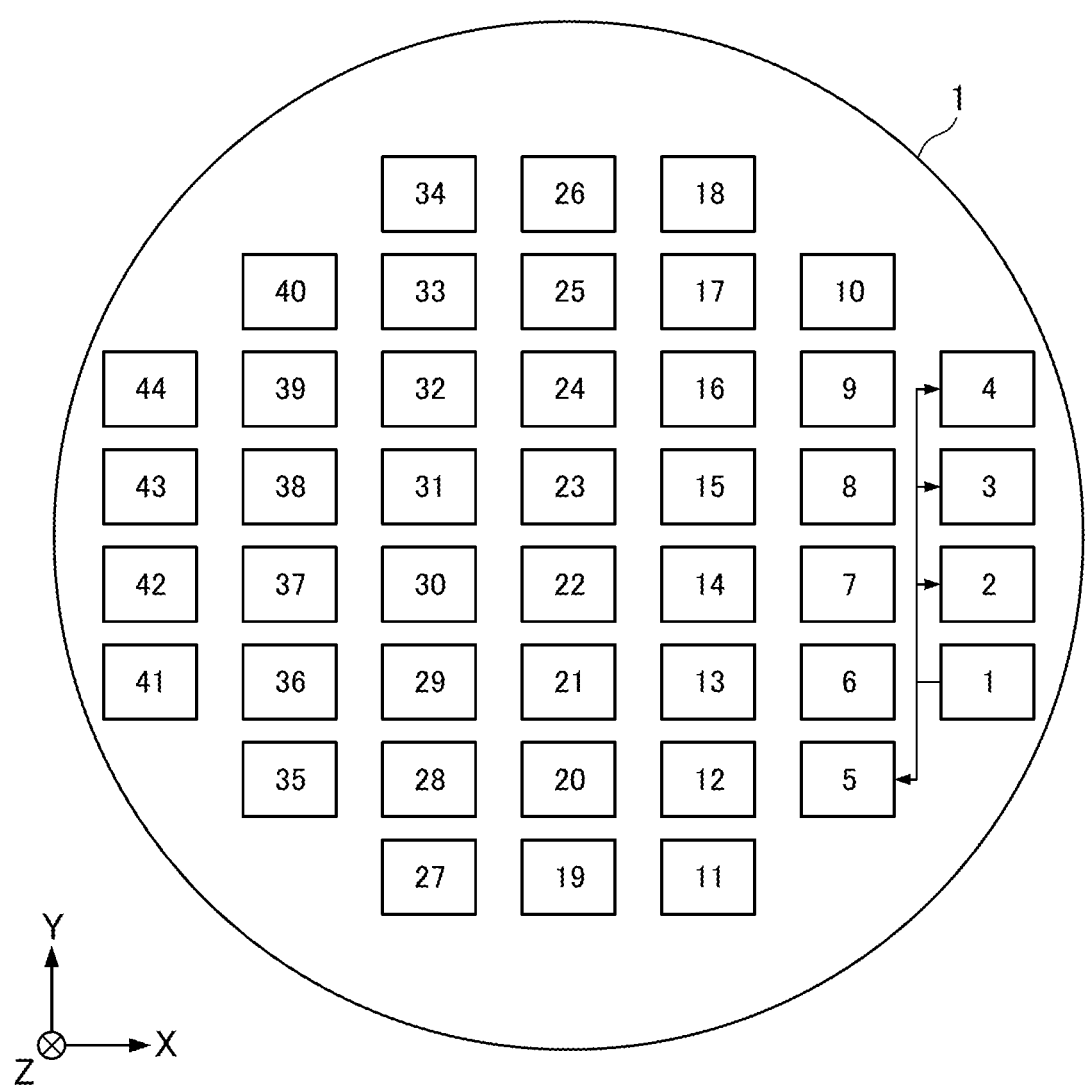
FIG. 3 is a diagram for describing a movement path of a substrate stage.

FIG. 3 is a diagram for describing a movement path of the substrate stage 3. In the embodiment, when the supply unit 20 is fixed to the alignment shelf 14 and the substrate stage 3 moves, a relative positional relationship between the discharge port 28 of the supply unit 20 and the substrate 1 changes. In FIG. 3, for the sake of simplicity of description, the locus of movement of the discharge port 28 on the substrate 1 is illustrated. As described above, in the imprint device 100 according to the embodiment, the mold stage 13 is disposed between the supply unit 20 and the conveying unit 22. For this reason, as illustrated in FIG. 3, by performing the imprint process from a shot region located on the conveying unit 22 side, it is possible to complete the imprint process of all of the shot regions without passing a shot region in which a pattern is formed through a portion immediately below the discharge port 28. Furthermore, the substrate 1 does not pass through a portion immediately below the discharge port 28 in the supply unit 20 if the substrate 1 moves along the shortest path at the time of unloading. Thus, the control unit 200 determines a movement path of the substrate stage 3 so that the imprint process is performed in the order illustrated in FIG. 3 and moves the substrate stage 3. Furthermore, the control unit 200 determines the shortest path as an unloading path also at the time of unloading and moves the substrate stage 3.

The control unit 200 determines the movement path of the substrate stage 3 and the order of the shot regions to be subjected to the imprint process on the basis of position information of all of the short regions formed on the substrate 1 and the disposition of the discharge port 28 in the supply unit 20. Furthermore, the control unit 200 determines the movement path of the substrate stage 3 in consideration of acceleration driving and deceleration driving of the substrate stage 3.

Figure 4A:
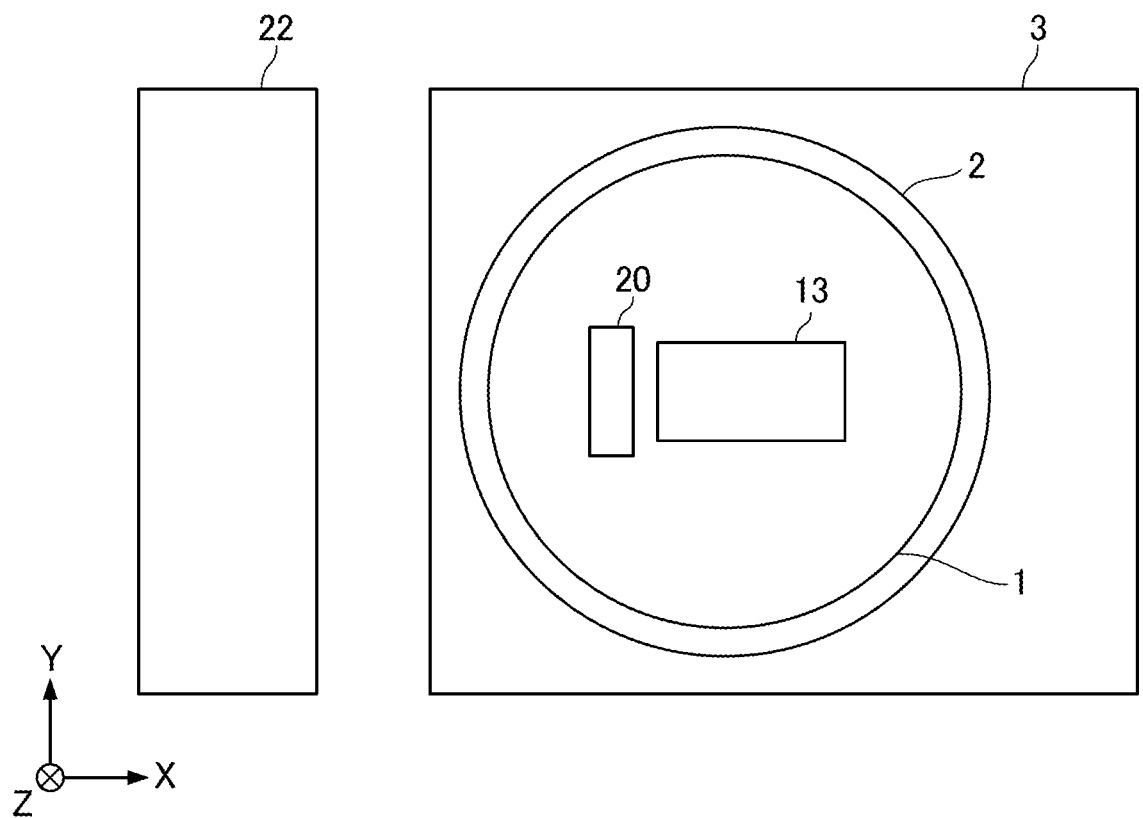
FIG. 4A is a diagram illustrating another example of the disposition of a mold stage, a supply unit, and a conveying unit.
Figure 4B:
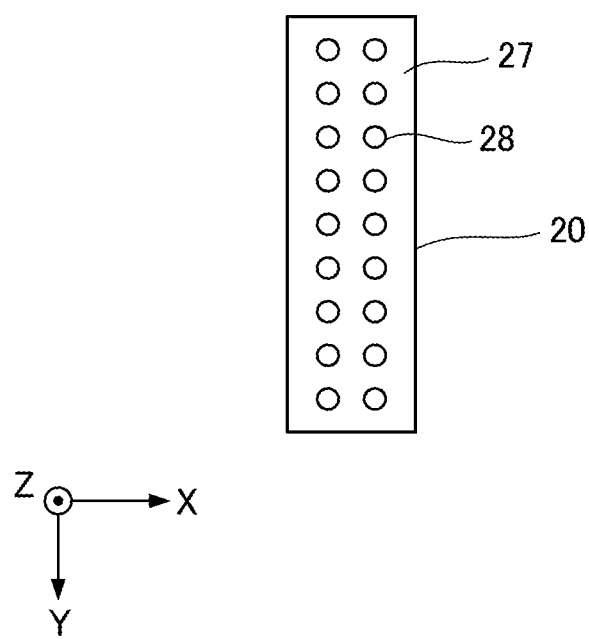
FIG. 4B is a diagram illustrating another example of the discharge port.

It should be noted that the control unit 200 may determine the movement path of the substrate stage 3 in consideration of the disposition of the conveying unit 22. FIGS. 4A and 4B are diagrams illustrating another example of the disposition of the mold stage 13, the supply unit 20, and the conveying unit 22. For example, it is assumed that the supply unit 20 is disposed between the mold stage 13 and the conveying unit 22 as illustrated in FIG. 4A and the supply unit 20 has the discharge port 28 illustrated in FIG. 4B. By performing the imprint process in the order illustrated in FIG. 3, during the imprint process, it is possible for a shot region having a pattern formed thereon to avoid a portion immediately below the discharge port 28. However, when the substrate stage 3 is moved along the shortest path at the time of unloading, the shot region having the pattern formed thereon passes through the portion immediately below the discharge port 28. In this case, the control unit 200 may move the substrate stage 3 not through the shortest path but through a path in which the substrate stage 3 avoids passing through the portion immediately below the discharge port 28.

Also, for example, when the substrate 1 includes a region in which a pattern is not formed, such as a region which is not used as an IC chip, the movement path of the substrate stage 3 may be determined on the basis of position information of the region in which the pattern is not formed. In addition, the control unit 200 determines the movement path of the substrate stage 3 so that a shot region in which a pattern is formed is also not disposed immediately below the discharge port 28 at the time of alignment.

Also, even when the imprint process is interrupted due to, for example, an occurrence of abnormality or the like, the control unit 200 moves the substrate stage 3 so that the shot region having the pattern formed thereon avoids to pass through the portion immediately below the discharge port 28. In this case, for example, a movement path is determined on the basis of position information of a shot region onto which a pattern has already been formed.

In this way, the path of the shot region having the pattern formed avoids the portion immediately below the discharge port so that it is possible to inhibit the mist of the imprint material which can be generated through the discharge port from adhering to the pattern.

Embodiment According to Method for Manufacturing Article

A method for manufacturing an article according to an embodiment of the present invention is appropriate for manufacturing, for example, an article such as a microdevice such as a semiconductor device and an element having a fine structure. The method for manufacturing an article in the embodiment includes a step of forming a pattern on an imprint material applied on a substrate 1 using the imprint device (a step of performing the imprint process on the substrate 1) and a step of processing the substrate 1 having a pattern formed thereon in such a step. In addition, such a manufacturing method includes other well-known steps (oxidation, film formation, evaporation, doping, planarization, etching, resist peeling, dicing, bonding, packaging, and the like). The method for manufacturing an article in the embodiment is advantageous in at least one of performance, quality, productivity, and production cost of an article as compared with the conventional method.

A pattern made of a cured product formed using an imprint device 100 is used permanently in at least a part of various articles or temporarily when various articles are manufactured. An article is an electric circuit element, an optical element, an MEMS, a recording element, a sensor, a mold, or the like. Examples of electric circuit elements include volatile or nonvolatile semiconductor memories such as a DRAM, an SRAM, a flash memory, and an MRAM, a semiconductor element such as an LSI, a CCD, an image sensor, and an FPGA, and the like. Examples of a mold include an imprinting mold and the like.

The pattern made of the cured product is used as is as a constituent member of at least a part of the above-described article or is temporarily used as a resist mask. After etching, ion implantation, or the like is performed in the step of processing the substrate 1, the resist mask is removed.

A specific manufacturing method of an article will be described below.

Figure 5A:
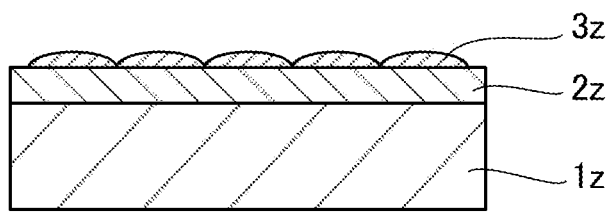
FIGS. 5A to 5F are diagrams illustrating a method for manufacturing an article.

As illustrated in FIG. 5A, a substrate $1z$ such as a silicon wafer having a surface on which a workpiece $2z$ such as an insulator is formed is prepared and then the imprint material $3z$ is applied to the surface of the workpiece $2z$ through an inkjet method or the like. Here, a state in which a plurality of droplet shapes of the imprint material $3z$ are applied onto the substrate 1 is illustrated.

Figure 5B:
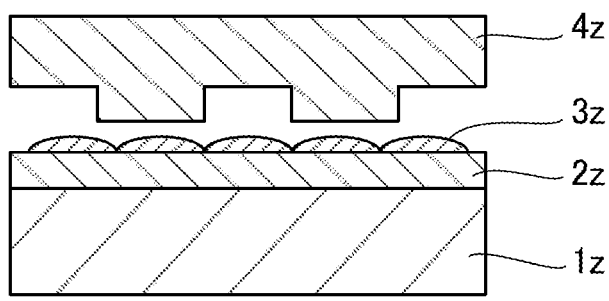

As illustrated in FIG. 5B, an imprinting mold $4z$ is arranged to be opposed to the imprint material $3z$ on the substrate 1 so that a side thereof having a concave-convex pattern formed thereon faces the imprint material 3z.

Figure 5C:
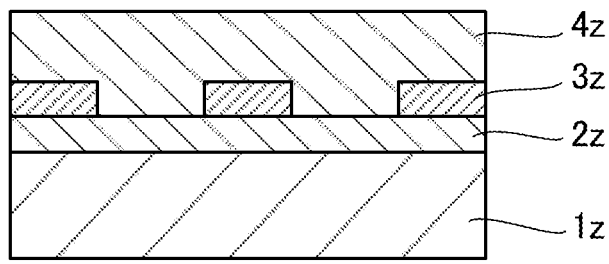

As illustrated in FIG. 5C, the substrate 1z having the imprint material 3z applied thereon is contact with and pressed by the mold 4z. As a result, a gap between the mold 4z and the workpiece 2z is filled with the imprint material 3z. In this state, by radiating light through the mold 4z as curing energy, the imprint material 3z cures.

Figure 5D:
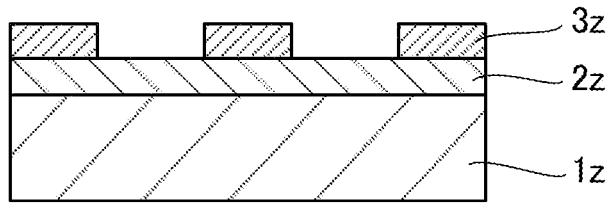

As illustrated in FIG. 5D, when the mold 4z and the substrate 1z are pulled apart after the imprint material 3z cured, a pattern formed of a cured product made of the imprint material 3z is formed on the substrate 1z. The pattern made of the cured product has a shape in which a concave portion of the mold corresponds to a convex portion of the cured product and a concave portion of the mold corresponds to a convex portion of the cured product. That is to say, a concave-convex pattern of the mold 4z is transferred to the imprint material 3z.

Figure 5E:
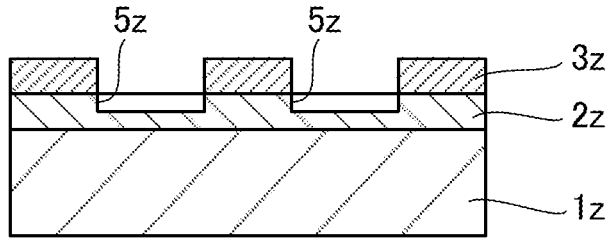

As illustrated in FIG. 5E, when etching is performed using the pattern made of the cured product as an etching resistant mask, a portion of a surface of the workpiece 2z on which the cured product is not present or the remaining thin portion is removed and a groove 5z is provided.

Figure 5F:
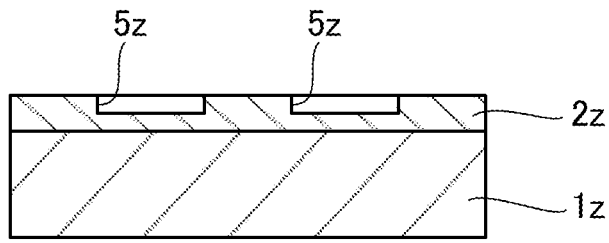

As illustrated in FIG. 5F, when the pattern made of the cured product is removed, it is possible to obtain an article having the groove 5z formed in the surface of the workpiece 2z. Here, although the pattern made of the cured product is removed, the pattern made of the cured product is used, for example, as an interlayer insulation film included in a semiconductor element or the like, that is, a constituent member of the article, without being removed after processing.

Although a preferred embodiment of the present invention has been described above, the present invention is not limited to the embodiment and various modifications and changes are possible without departing from the gist of the present invention.

Other Embodiment

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-077549 filed on Apr. 13, 2018, which are hereby incorporated by reference herein in its entirety.

What is claimed is:

1. An imprint device for forming a pattern made of an imprint material on a shot region formed on a substrate using a mold, comprising:
    a supply unit configured to discharge the imprint material through a discharge port and supply the imprint material onto the substrate;
    a substrate stage configured to hold and move the substrate; and
    a control unit configured to control the substrate stage, wherein the control unit is configured to control the substrate stage so as to move the substrate stage so that a shot region already having the pattern made of the imprint material formed thereon avoids a position immediately below the discharge port.

2. The imprint device according to claim 1, wherein the control unit is configured to control the substrate stage so as to move the substrate stage on a basis of position information of a plurality of shot regions formed on the substrate and a disposition of the discharge port.

3. The imprint device according to claim 1, wherein the control unit is configured to control the substrate stage so as to move the substrate stage on a basis of position information of the shot region already having the pattern formed thereon.

4. The imprint device according to claim 1, wherein the control unit is configured to control the substrate stage so as to move the substrate stage on a basis of position information of a region on which a pattern is not formed on the substrate.

5. The imprint device according to claim 1, wherein the control unit is configured to determine an unloading path of the substrate stage on a basis of a disposition of a conveying unit for unloading the substrate from the imprint device.

6. The imprint device according to claim 5, wherein the control unit is configured to determine a movement path of the substrate stage from when the substrate is held by the substrate stage to when the substrate is unloaded from the conveying unit.

7. An imprint method for forming a pattern made of an imprint material on a shot region formed on a substrate using a mold, comprising:
    discharging the imprint material through a discharge port and supplying the imprint material onto the substrate; and
    moving the substrate so that a shot region already having the pattern made of the imprint material formed thereon avoids a position immediately below the discharge port when the substrate is moved.

8. A method for manufacturing an article using an imprint device for forming a pattern made of an imprint material using a mold on a shot region formed on a substrate, the method comprising:
    discharging the imprint material through a discharge port and supplying the imprint material onto the substrate;
    moving the substrate so that a shot region already having the pattern made of the imprint material formed thereon avoids a position immediately below the discharge port when the substrate is moved; and
    processing the substrate having the pattern formed in the above steps.

* * * * *